(12) United States Patent  (10) Patent No.: US 12,040,206 B2
Gao  (45) Date of Patent: Jul. 16, 2024

(54) VENTILATED PUCK

(71) Applicant: BEIJING TONGMEI XTAL TECHNOLOGY CO., LTD., Beijing (CN)

(72) Inventor: Wei Gao, Fremont, CA (US)

(73) Assignee: Beijing Tongmei Xtal Technology Co., Ltd., Beijing (CN)

( * ) Notice: Subject to any disclaimer, the term of this patent is extended or adjusted under 35 U.S.C. 154(b) by 113 days.

(21) Appl. No.: 17/697,069

(22) Filed: Mar. 17, 2022

(65) Prior Publication Data

US 2022/0415685 A1 Dec. 29, 2022

(30) Foreign Application Priority Data

Jun. 25, 2021 (CN) .......................... 202121430111.8

(51) Int. Cl.
*H01L 21/673* (2006.01)
*B65D 51/16* (2006.01)

(52) U.S. Cl.
CPC ........ *H01L 21/67393* (2013.01); *B65D 51/16* (2013.01); *H01L 21/67386* (2013.01); *B65D 2205/00* (2013.01)

(58) Field of Classification Search
CPC ............................ B65D 51/16; B65D 2205/00
USPC ........................................................ 206/710
See application file for complete search history.

(56) References Cited

U.S. PATENT DOCUMENTS

| 4,483,441 | A  | * | 11/1984 | Akizawa | B65D 81/113 |
| | | | | | 206/718 |
| 8,458,996 | B2 | * | 6/2013 | Bried | B65B 7/28 |
| | | | | | 53/129.1 |
| 9,497,992 | B2 | * | 11/2016 | Evans | B65D 55/06 |
| 2003/0051665 | A1 | * | 3/2003 | Zhao | C23C 16/5096 |
| | | | | | 712/42 |
| 2005/0077282 | A1 | * | 4/2005 | Keller | B65D 23/00 |
| | | | | | 219/401 |
| 2005/0269241 | A1 | * | 12/2005 | Brooks | H01L 21/67353 |
| | | | | | 206/832 |
| 2009/0014343 | A1 | * | 1/2009 | Clark | A24F 23/00 |
| | | | | | 206/265 |
| 2009/0095169 | A1 | * | 4/2009 | York | A47J 27/004 |
| | | | | | 220/573.5 |

(Continued)

FOREIGN PATENT DOCUMENTS

CN 213650253 U * 7/2021

*Primary Examiner* — Ernesto A Grano
*Assistant Examiner* — Symren K Sanghera
(74) *Attorney, Agent, or Firm* — Clements Bernard Walker; Christopher L. Bernard

(57) ABSTRACT

A ventilated puck is provided. The ventilated puck includes an upper box, a spider plate, and a lower box. In particular, the upper box is fitted on the lower box to form a hollow structure, in which the spider plate is disposed. A ventilation channel for communicating the hollow structure with an external environment is provided in the upper box, or in the lower box or at interface between the upper box and the lower box. The ventilated puck of the present application may ensure gas exchange during the gas protection process conducted on semiconductor wafers, thereby preventing deformation of the puck due to pressure differences. Optionally, the interior of the ventilation channel is provided with a dustproof labyrinth structure, thereby preventing the entry of dust.

5 Claims, 7 Drawing Sheets

(56) References Cited

U.S. PATENT DOCUMENTS

| | | | |
|---|---|---|---|
| 2019/0202608 A1* | 7/2019 | Evans | B65D 51/1622 |
| 2022/0352006 A1* | 11/2022 | Huang | H01L 21/68735 |
| 2022/0415684 A1* | 12/2022 | Gao | H01L 21/67373 |
| 2023/0211928 A1* | 7/2023 | Sanchez | B65D 50/04 |
| | | | 215/217 |

* cited by examiner

VENTILATED PUCK

PRIORITY CLAIM

The present application claims the benefits of Chinese Application 202121430111.8 filed on Jun. 25, 2021, the contents of which are hereby incorporated by reference.

TECHNICAL FIELD

The present application relates to a ventilated puck, and in particularly, to a ventilated puck for containing semiconductor wafers and having a dustproof function.

BACKGROUND

In semiconductor wafer manufacturing industry, puck is a common container component for containing semiconductor wafers. During the production of semiconductor wafers, it is required to apply gas protection to the semiconductor wafers at appropriate steps. In prior art, a method for applying gas protection to semiconductor wafers mainly includes the following steps: firstly placing a puck together with a semiconductor wafer into a packaging bag, and subsequently vacuuming the packaging bag; then inflating the packaging bag with protective gas (nitrogen, noble gas, etc.). This operation effectively replaces the air around the semiconductor wafer with protective gas with more stable chemical properties, thereby achieving gas protection.

Common puck in prior art comprises an upper box, a spider plate and a lower box. In particular, the upper box is fitted on the lower box to form a hollow structure, in which the spider plate is disposed. In use, the semiconductor wafer is first placed in the lower box, the spider plate is then provided on the semiconductor wafer (the spider plate is used to hold the semiconductor wafer in place in the puck), and the upper box is finally fitted in place. In the case of a tight fit between the upper box and the lower box, the whole puck is nearly sealed, which will lead to a poor gas exchange between interior and exterior. More specifically, during the process of vacuuming, the gas inside the puck cannot flow out smoothly, as a result of which the internal pressure is greater than the external pressure, and the puck is expanded and deformed. During the process of inflation, the gas outside the puck cannot flow in smoothly, as a result of which the external pressure is greater than the external pressure, and the puck is compressed and deformed. In addition, the compression deformation of the puck sometimes would press the spider plate inside the puck onto the wafer surface and cause imprints on the wafer surface.

Therefore, there is a need to develop an improved ventilated puck. The ventilated puck has a ventilation channel for connecting the hollow structure with the external environment, and thus may improve poor gas exchange between interior and exterior, thereby preventing contamination of the wafer surface caused by deformation of the puck.

SUMMARY

In an aspect, a ventilated puck for containing semiconductor wafers or other suitable sheet-like objects is described.

In particular, the present application provides a ventilated puck, comprising
an upper box,
a spider plate, and
a lower box;
wherein the upper box is fitted on the lower box to form a hollow structure, in which the spider plate is disposed; a ventilation channel for communicating the hollow structure with an external environment is provided in the upper box, in the lower box or at the connection between the upper box and the lower box.

In an embodiment of the present application, the ventilation channel also has a dustproof structure. More specifically, the interior of the ventilation channel is provided with a dustproof labyrinth structure, which promotes the passage of gas while preventing the entry of dust into the ventilation channel. The dustproof labyrinth structure may be described as providing a plurality of protrusions or barriers within a gap or passage, such that the inner diameter dimension of the gap or the passage changes constantly along the direction of its length. In this case, when gas passes through the gap or the passage, the constantly changing inner diameter dimension causes a constant change of the flow rate of the gas, so that the dust settles at a section which has larger inner diameter and slower flow rate, thereby achieving the dustproof purpose.

It should be understood that the term "bottom face, top face, upward, downward" used herein is described based on the orientation of the ventilated puck shown in FIG. 1, that is to say, the bottom face of the upper box is disposed opposite to the top face of the lower box.

It should also be understood that the ventilated puck of the present application is suitable for containing both semiconductor wafers and other types of sheet-like objects.

The ventilated puck of the present application has the ventilation channel for communicating the hollow structure with the external environment, and thus may improve poor gas exchange between interior and exterior, thereby preventing contamination of the wafer surface caused by deformation of the puck.

BRIEF DESCRIPTION OF THE DRAWINGS

The advantages and features of the present application will now be described in details with reference to the accompanying drawings, in which the components are not necessarily drawn to scale, in which.

Figure 1:
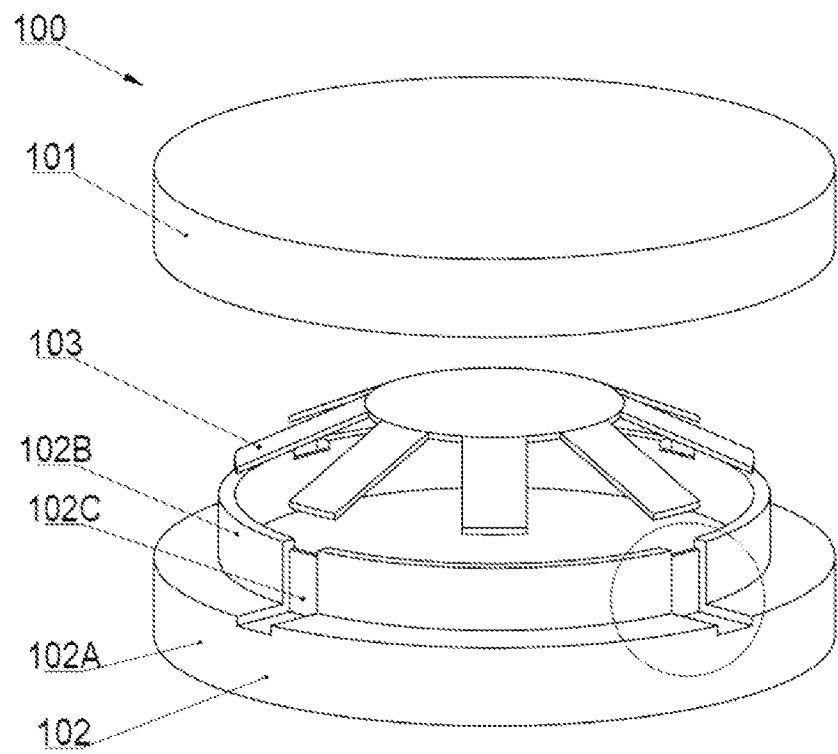
FIG. 1 shows an exploded perspective view of a ventilated puck according to a first embodiment of the present application.

It should be understood that the accompanying drawings are drawn for exemplary purposes only and should not be considered as limitations on the present application.

DETAILED DESCRIPTION

A ventilated puck comprises
an upper box,
a spider plate, and
a lower box;
wherein the upper box is fitted on the lower box to form a hollow structure, in which the spider plate is disposed; a ventilation channel for communicating the hollow structure with an external environment is provided in the upper box, in the lower box or at the connection between the upper box and the lower box.

The spider plate is a common part in the art, and its function is to retain a semiconductor wafer in a puck and to prevent scratching of the surface of the semiconductor wafer resulting from the movement of the semiconductor wafer in the puck. Generally, the spider plate is a sheet-like part with a central elevated portion, the central elevated portion of the sheet-like part rests against an inner top face of the upper box, and the edge of the sheet-like part is used to hold the semiconductor wafer in place.

The present application is suitable for both semiconductor wafers and other parts that require gas protection.

For the ventilated puck according to the present application, in an embodiment, the upper box is cylindrical, the upper box opens at bottom and is lid-shaped as a whole; the lower box comprises a main body, which is cylindrical, and an annular flange, which extends upward on a top face of the main body of the lower box, is concentric with the main body of the lower box, and has an outer diameter that is smaller than the maximum diameter of the main body of the lower box. The upper box is fitted on the annular flange, with a bottom face of the upper box being placed on the top face of the main body of the lower box, thereby forming the hollow structure. The spider plate is a sheet-like part with a central elevated portion, and is positioned in the annular flange in a way that the central elevated portion faces up, wherein the central elevated portion of the spider plate rests against the inner top face of the upper box when the upper box and the lower box are fitted together.

In the embodiments, the ventilation channel is provided between the upper box and the lower box, and is defined by an inner circumferential face of the upper box, the bottom face of the upper box, the top face of the main body of the lower box and an outer circumferential face of the annular flange together. Additionally, a knurled or serrated structure may be arranged on an outer circumferential face of the upper box and on a circumferential face of the main body of the lower box. The knurled or serrated structure achieves the technical effect of easy picking up. The spider plate comprises an elevated central circular portion, and a plurality of legs extending outwardly from the edge of the central circular portion, wherein the plurality of legs are arranged evenly around the circumference of the central circular portion, and each of which has an end in the form of square. In embodiments, a single ventilation channel is provided at interface between the upper box and the lower box, or a plurality of ventilation channels is provided circumferentially provided at interface between the upper box and the lower box evenly or unevenly. The plurality of ventilation channels further promotes the flow of gas, thereby improving gas exchange.

According to an embodiment, the ventilated puck may include three ventilation channels arranged along the circumference. In this case, the arrangement of the ventilation channels is more aesthetic and reasonable, and allows the gas to flow through the ventilation channels more easily, which arrangement reduces the possibility of flow resistance caused by the convection of the oppositely arranged ventilation channels.

In an embodiment, the ventilation channel comprises an L-shaped groove provided at interface between the upper box and the lower box; when provided in the lower box, the L-shaped groove extends radially from the edge of the top face of the main body of the lower box, turns 90 degrees at an interface between the main body of the lower box and the annular flange, and extends upward in the outer circumferential face of the annular flange across the entire annular flange; the L-shaped groove is provided with a notch for facilitating the passage of gas at a top edge of the annular flange; when provided in the upper box, the L-shaped groove extends radially from the edge of the bottom face of the upper box to an opposite side of the bottom face of the upper box, turns 90 degrees, and extends upward in the inner circumferential face of the upper box across the entire inner circumferential face of the upper box; the L-shaped groove is provided with a recess for facilitating the passage of gas in the inner top face of the upper box. Additionally, the L-shaped groove is provided with a plurality of protrusions at the bottom, which are arranged at equal or unequal spacings; the widths of the protrusions are the same as that of the L-shaped groove, and the heights of the protrusions are less than the depth of the L-shaped groove. In this case, the protrusion structures on the L-shaped groove change the inner diameter size of the ventilation channel, so that the ventilation channel has a dustproof labyrinth structure, which in turn prevents the entry of dust.

In an embodiment, the ventilation channel comprises a zigzag-shaped groove provided in the lower box or in the upper box; when provided in the lower box, the zigzag-shaped groove extends radially from the edge of the top face of the main body of the lower box, turns 90 degrees at the interface between the main body of the lower box and the annular flange, extends upward in the outer circumferential face of the annular flange, extends circumferentially in the outer circumferential face of the annular flange, and extends upward in the outer circumferential face of the annular flange across the entire outer circumferential face of the annular flange; the zigzag-shaped groove is provided with a notch for facilitating the passage of gas at the top edge of the annular flange; when provided in the upper box, the zigzag-shaped groove extends radially from the edge of the bottom face of the upper box to an opposite side of the bottom face of the upper box, turns 90 degrees, extends upward in the inner circumferential face of the upper box, extends circumferentially in the inner circumferential face of the upper box, and extends upward in the inner circumferential face of the upper box across the entire inner circumferential face of the upper box; the zigzag-shaped groove is provided with a recess for facilitating the passage of gas in the inner top face of the upper box. Additionally, the zigzag-shaped groove is provided with a plurality of protrusions at the bottom, wherein the plurality of protrusions are arranged at equal or unequal spacings; the widths of the protrusions are the same as that of the zigzag-shaped groove, and the heights of the protrusions are less than the depth of the zigzag-shaped groove. Compared with the embodiment with the L-shaped groove described above, the zigzag-shaped groove provides a greater ventilation channel length, thereby further improving the dustproof performance of the ventilation channel.

In an embodiment, the ventilation channel comprises an annular groove provided on the outer circumferential face of the annular flange or on the inner circumferential face of the upper box; the annular groove is provided with at least one upper ventilation groove which communicates the hollow structure with the annular groove, and at least one lower ventilation groove which communicates the annular groove with the external environment. Additionally, the annular groove is provided with a plurality of protrusions at the bottom, wherein the plurality of protrusions are arranged at equal or unequal spacings; the widths of the protrusions are the same as that of the annular groove, and the heights of the protrusions are less than the depth of the annular groove; when provided in the outer circumferential face of the annular flange, the annular groove is concentric with the annular flange, and the upper ventilation groove is a straight groove which extends upward from the annular groove across the outer circumferential face of the annular flange, wherein the straight groove is provided with a notch for facilitating the passage of gas at the top edge of the annular flange; the lower ventilation groove is a short L-shaped groove which extends radially from the edge of the top face of the main body of the lower box, turns 90 degrees at the interface between the main body of the lower box and the annular flange, and extends upward in the outer circumferential face of the annular flange to the annular groove; when provided in the inner circumferential face of the upper box, the annular groove is concentric with the upper box, and the upper ventilation groove is a straight groove which extends upward from the annular groove across the inner circumferential face of the upper box, wherein the straight groove is provided with a recess for facilitating the passage of gas on the inner top face of the upper box; the lower ventilation groove is a short L-shaped groove which extends radially from the edge of the bottom face of the upper box, turns 90 degrees at the interface between the bottom face of the upper box and the inner circumferential face of the upper box, and extends upward in the inner circumferential face of the upper box to the annular groove. Additionally, the straight groove and the short L-shaped groove may be staggered at equal spacing along the circumference of the lower box or the upper box. Compared with the embodiment with the zigzag-shaped groove described above, the annular groove utilizes the entire outer circumferential face of the annular flange to maximize the length of the ventilation channel, thereby further improving the dustproof performance of the ventilation channel.

In some cases, the ventilation channel of the ventilated puck described may be an L-shaped groove with flat bottom. In order to prevent dust from entering the inside of the puck, four more embodiments are provided in the following context.

The first embodiment of the present application has an L-shaped groove with protrusions. The protrusions form a dustproof labyrinth structure, and thus prevent dust from entering. However, since the length of the L-shaped groove corresponds mainly to the height of the annular flange, the length of the L-shaped groove cannot be extended arbitrarily. For this reason, if the increase in this length is desired, the second embodiment of the present application may be considered.

The second embodiment differs from the basic embodiment mainly in that the ventilation channel comprises a zigzag-shaped groove with a flat bottom, instead of an L-shaped groove with a flat bottom. Compared with the L-shaped groove, the zigzag-shaped groove is provided with a horizontal groove segment which extends circumferentially along the annular flange; this extends the length of the zigzag-shaped groove, thereby improving the dustproof performance of the ventilation channel. However, if further enhancement of the dustproof performance of the ventilation channel is desired, the third embodiment of the present application may be considered.

The third embodiment differs from the second embodiment mainly in that the zigzag-shaped groove has protrusions. The protrusions form a dustproof labyrinth structure, and thus prevent dust from entering. However, if further extension of the length of the ventilation channel is desired, the fourth embodiment of the present application may be considered.

The fourth embodiment differs from the third embodiment mainly in that the ventilation channel comprises an annular groove, instead of a zigzag-shaped groove. The annular groove utilizes the entire outer circumferential face of the annular flange to maximize the length of the ventilation channel, thereby further improving the dustproof performance of the ventilation channel.

The ventilated puck of the present application may be manufactured from plastic, metal and other materials, and may be prepared by using common machine-shaping methods. More specifically, the plastic material can be ABS, nylon, polyurethane, etc.; the metal material may be steel, cast iron, aluminum, copper, etc. If a plastic material is adopted, the common machine-shaping methods are injection molding, molding, extrusion, and other methods. If a metal material is adopted, the common machine-shaping methods are machining, casting, stamping, bending, and other methods.

In use, semiconductor wafers or other sheet-like objects are placed on the lower box, and the upper box is subsequently fitted on the lower box. After that, other operations such as vacuuming or inflation with protective gas may continue to be implemented.

The following is an exemplary description of the present application in conjunction with the accompanying drawings, wherein the components in the accompanying drawings are made of plastic as an exemplary material, and are prepared by injection molding, molding, extrusion, and other methods.

Figure 2:
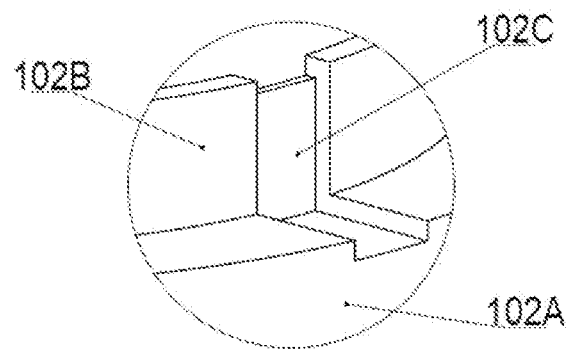
FIG. 2 is a partial view of FIG. 1, which shows details of an L-shaped groove.
Figure 3:
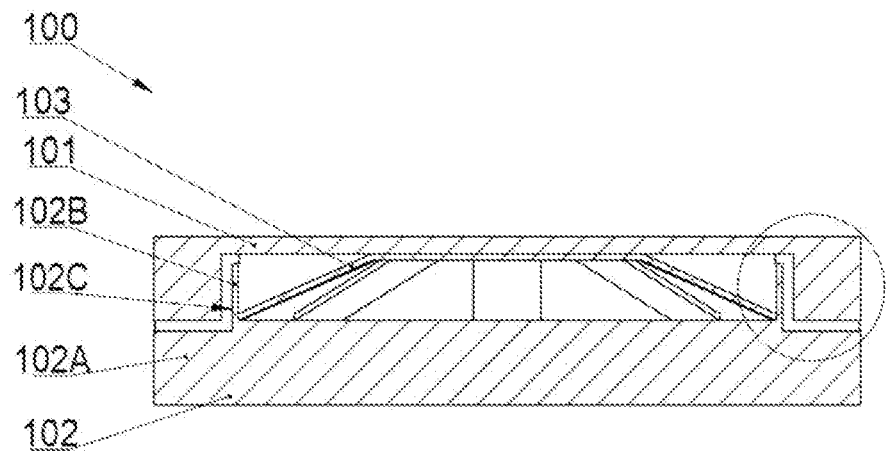
FIG. 3 shows a cross-sectional view of the ventilated puck shown in FIG. 1 in an assembled state, wherein the ventilated puck is sectioned along a horizontal plane that passes through a ventilation channel.
Figure 4:
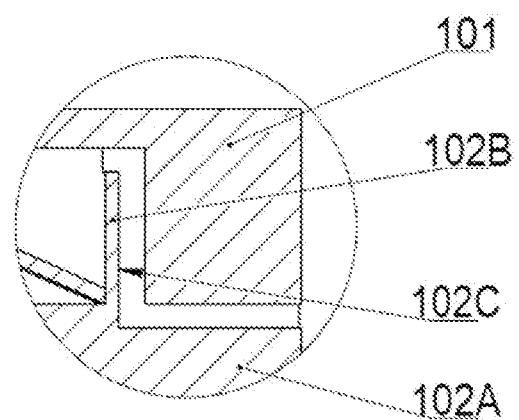
FIG. 4 is a partial view of FIG. 3, which further shows details of the ventilation channel.

FIG. 1 shows an exploded perspective view of a ventilated puck according to a first embodiment of the present application, the ventilated puck as a whole being represented by reference sign 100. In particular, the ventilated puck 100 comprises an upper box 101, a spider plate 103, and a lower box 102. The upper box 101 is cylindrical which opens at a bottom face, and is lid-shaped as a whole. The lower box 102 comprises a main body 102A, which is in a cylindrical shape that corresponds to the upper box 101, and an annular flange 102B, which extends upward on a top face of the main body 102A of the lower box, is concentric with the main body 102A of the lower box, and has an outer diameter that is smaller than the diameter of the main body 102A of the lower box. It should be understood that, although not shown, an outer circumferential face of the upper box 101 and a circumferential face of the main body 102A of the lower box are provided with a serrated structure, respectively. The upper box 101 is fitted on the annular flange 102B, with the bottom face of the upper box 101 being placed on the top face of the main body 102A of the lower box, thus forming a hollow structure, in which the spider plate 103 is disposed. In FIG. 1, it exemplarily shows that the spider plate 103 comprises an elevated central circular portion, and eight legs extending outwardly from the rim of the central circular portion, which legs are arranged evenly around the circumference of the central circular portion, and each of which has an end in the form of square. In addition, the circumference of the lower box 102 is uniformly provided with four L-shaped grooves 102C. The L-shaped groove 102C extends radially from the edge of the top face of the main body 102A of the lower box, turns 90 degrees at an interface between the main body 102A and the annular flange 102B of the lower box, and extends upward in an outer circumferential face of the annular flange 102B across the entire annular flange 102B. It should be understood that, although the lower box 102 is uniformly provided with four L-shaped grooves 102C in this embodiment, it is also conceivable to provide more or fewer L-shaped grooves 102C. FIG. 2 is a partial view of FIG. 1, which shows details of the L-shaped groove 102C. As shown in FIG. 2, the L-shaped groove 102C has a flat bottom, and the L-shaped groove 102C is provided with a notch for facilitating the passage of gas at a top edge of the annular flange 102B. FIG. 3 shows a cross-sectional view of the ventilated puck 100 shown in FIG. 1 in an assembled state, wherein the ventilated puck 100 is sectioned along a horizontal plane that passes through the ventilation channel. As shown in FIG. 3, the ventilation channel of the ventilated puck 100 is defined by the L-shaped groove 102C which is located in the top face of the main body 102A of the lower box and in the outer circumferential face of the annular flange 102B, the inner circumferential face of the upper box 101, and the bottom face of the upper box 101 together. FIG. 4 is a partial view of FIG. 3, which further shows details of the ventilation channel. As shown in FIG. 4, the ventilation channel communicates the interior with the exterior of the ventilated puck 100, allowing gas to easily flow into or flow out of the ventilated puck 100.

Figure 5:
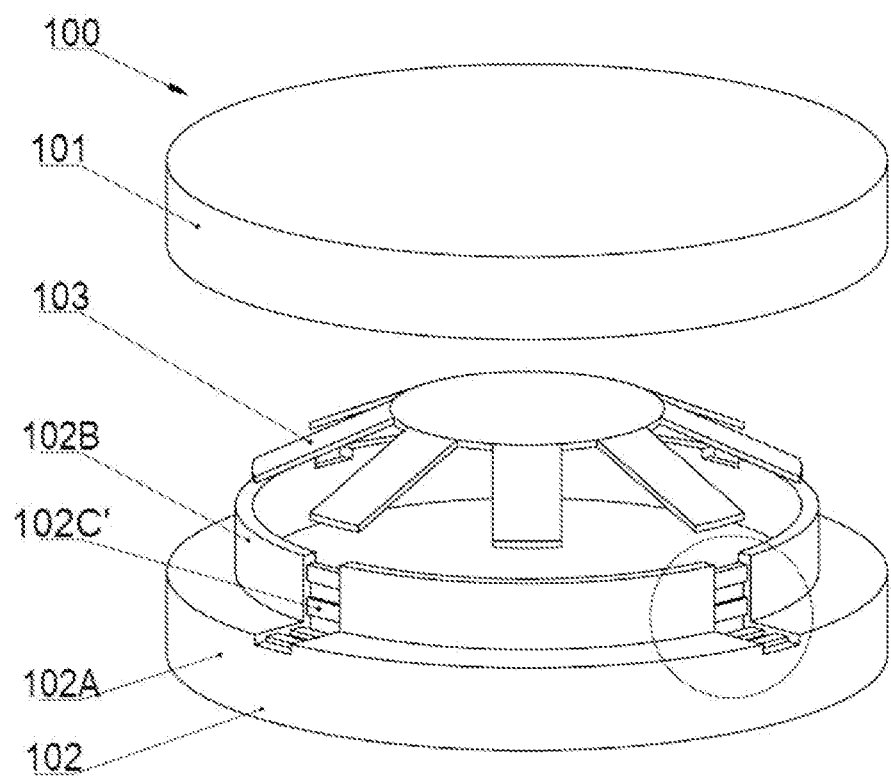
FIG. 5 shows an exploded perspective view of the ventilated puck according to a second embodiment of the present application.
Figure 6:
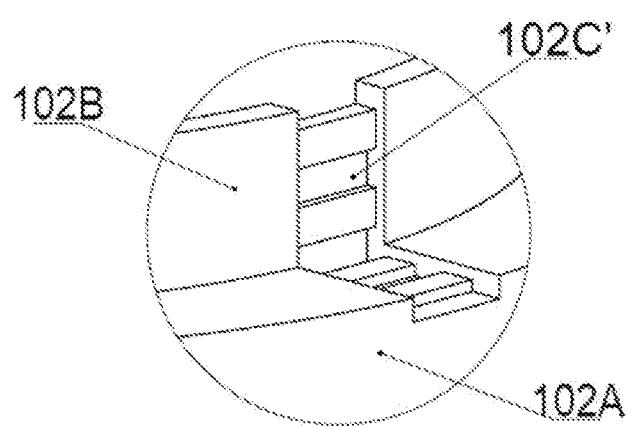
FIG. 6 is a partial view of FIG. 5, which shows details of an L-shaped groove.
Figure 7:
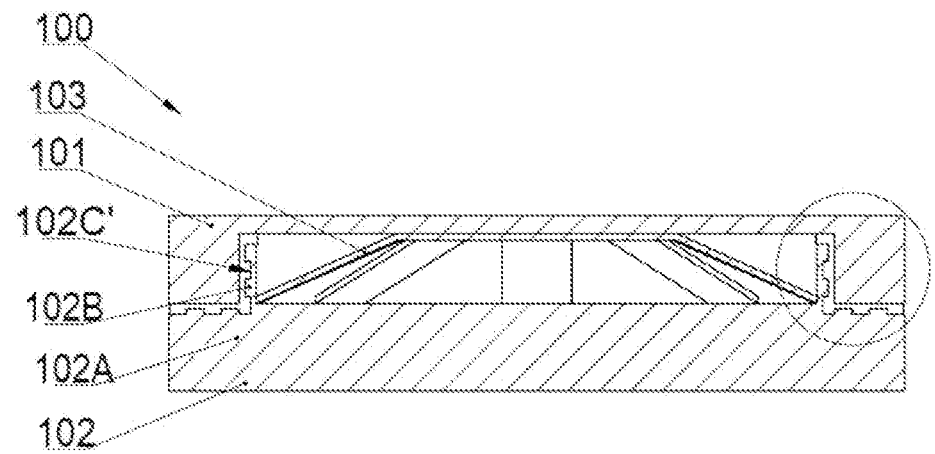
FIG. 7 shows a cross-sectional view of the ventilated puck shown in FIG. 5 in an assembled state, wherein the ventilated puck is sectioned along a horizontal plane that passes through the ventilation channel.
Figure 8:
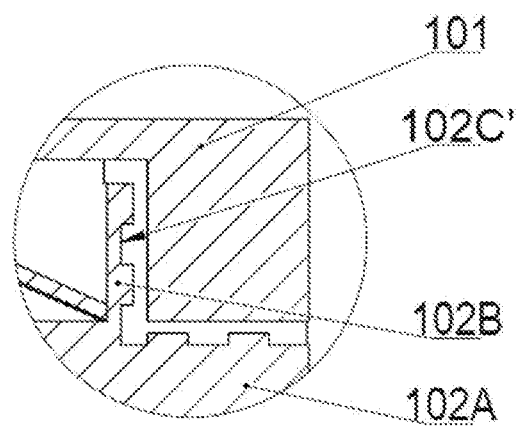
FIG. 8 is a partial view of FIG. 7, which further shows details of the ventilation channel.

FIG. 5 shows an exploded perspective view of the ventilated puck 100 according to a second embodiment of the present application. For the sake of simplicity, the technical features of this embodiment that are the same as those of the embodiment shown in FIG. 1 will not be repeated. The embodiment shown in FIG. 5 differs from the embodiment shown in FIG. 1 mainly in that an L-shaped groove 102C' is provided with protrusions at the bottom thereof. FIG. 6 is a partial view of FIG. 5, which shows details of the L-shaped groove 102C'. As shown in FIG. 6, the protrusions may be four rectangular protrusions extending from the bottom of the L-shaped groove 102C'. In particular, two rectangular protrusions are provided in the outer circumferential face of the annular flange 102B, and the other two rectangular protrusions are provided in the top face of the main body 102A. The rectangular protrusions are arranged at equal spacing, the widths of which are as same as that of the L-shaped groove 102C', and the heights of which are less than the depth of the L-shaped groove 102C'. FIG. 7 shows a cross-sectional view of the ventilated puck 100 shown in FIG. 5 in an assembled state, wherein the ventilated puck 100 is sectioned along a horizontal plane that passes through the ventilation channel. Similarly, as shown in FIG. 7, the ventilation channel of the ventilated puck 100 is defined by the L-shaped groove 102C' which is located in the top face of the main body 102A of the lower box and in the outer circumferential face of the annular flange 102B, the inner circumferential face of the upper box 101, and the bottom face of the upper box 101 together. FIG. 8 is a partial view of FIG. 7, which further shows details of the ventilation channel. As shown in FIG. 8, the ventilation channel communicates the interior with the exterior of the ventilated puck 100, and the rectangular protrusion structures on the L-shaped groove 102C' also change the inner diameter size of the ventilation channel, which make the ventilation channel have a dustproof labyrinth structure, thus achieving the function of preventing dust from entering.

Figure 9:
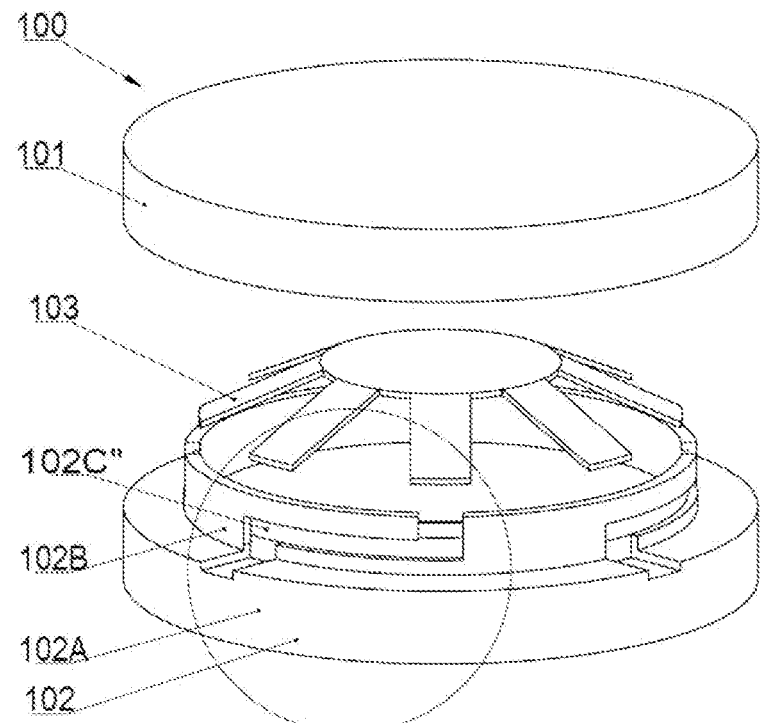
FIG. 9 shows an exploded perspective view of the ventilated puck according to a third embodiment of the present application.
Figure 10:
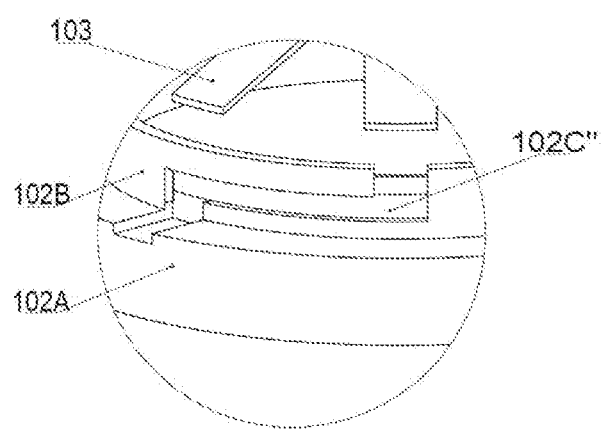
FIG. 10 is a partial view of FIG. 9, which shows details of a zigzag-shaped groove.

FIG. 9 shows an exploded perspective view of the ventilated puck 100 according to a third embodiment of the present application. For the sake of simplicity, the technical features of this embodiment that are the same as those of the embodiment shown in FIG. 1 will not be repeated. The embodiment shown in FIG. 9 differs from the embodiment shown in FIG. 1 mainly in that the ventilated puck 100 has a zigzag-shaped groove 102C" with a flat bottom, instead of an L-shaped groove. The zigzag-shaped groove 102C" extends radially from the edge of the top face of the main body 102A of the lower box, turns 90 degrees at the interface between the main body 102A of the lower box and the annular flange 102B, extends upward in the outer circumferential face of the annular flange 102B, extends circumferentially in the outer circumferential face of the annular flange 102B, and continues to extend upward in the outer circumferential face of the annular flange 102B across the entire outer circumferential face of the annular flange 102B. The zigzag-shaped groove 102C" is provided with a notch for facilitating the passage of gas at the top edge of the annular flange 102B. FIG. 10 is a partial view of FIG. 9, which shows details of a zigzag-shaped groove 102C". Although the lower box 102 is uniformly provided with four zigzag-shaped grooves 102C" in this embodiment, it is also conceivable to provide more or fewer zigzag-shaped groove 102C".

Figure 11:
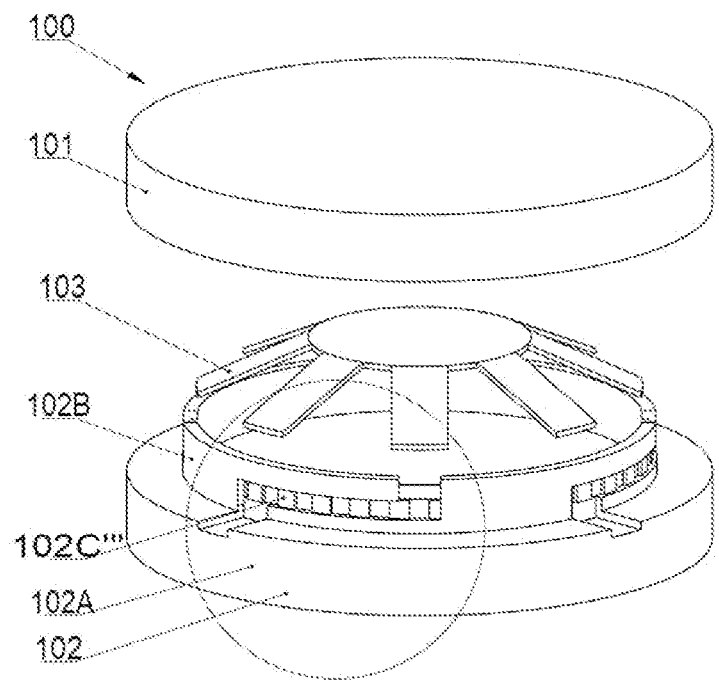
FIG. 11 shows an exploded perspective view of the ventilated puck according to a fourth embodiment of the present application.
Figure 12:
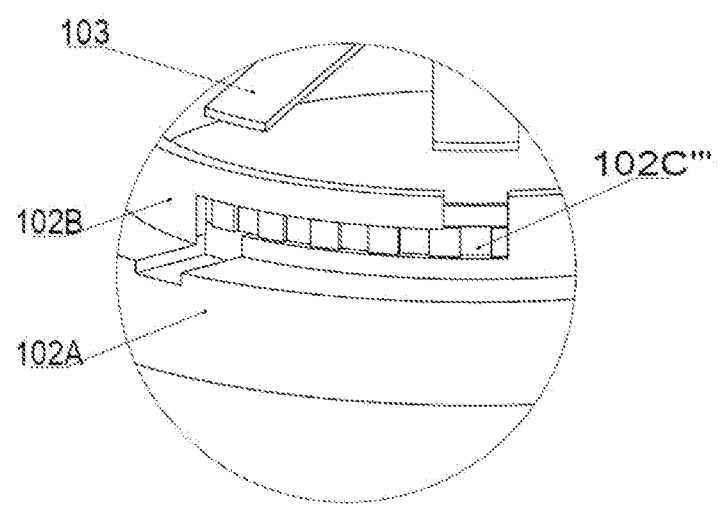
FIG. 12 is a partial view of FIG. 11, which shows details of a zigzag-shaped groove.

FIG. 11 shows an exploded perspective view of the ventilated puck 100 according to a fourth embodiment of the present application. For the sake of simplicity, the technical features of this embodiment that are the same as those of the embodiment shown in FIG. 9 will not be repeated. The embodiment shown in FIG. 11 differs from the embodiment shown in FIG. 9 mainly in that a zigzag-shaped groove 102C''' is provided with protrusions at the bottom thereof. FIG. 12 is a partial view of FIG. 11, which shows details of the zigzag-shaped groove 102C'''. The circumferential extension section of the zigzag-shaped groove 102C''' may be provided with six rectangular protrusions, the widths of which are the same as that of the circumferential extension section of the zigzag-shaped groove 102C''', and the heights of which are less than the depth of the zigzag-shaped groove 102C'''. It should be understood that, although the lower box 102 is uniformly provided with four zigzag-shaped grooves 102C''' in this embodiment, it is also conceivable to provide more or fewer zigzag-shaped groove 102C'''.

Figure 13:
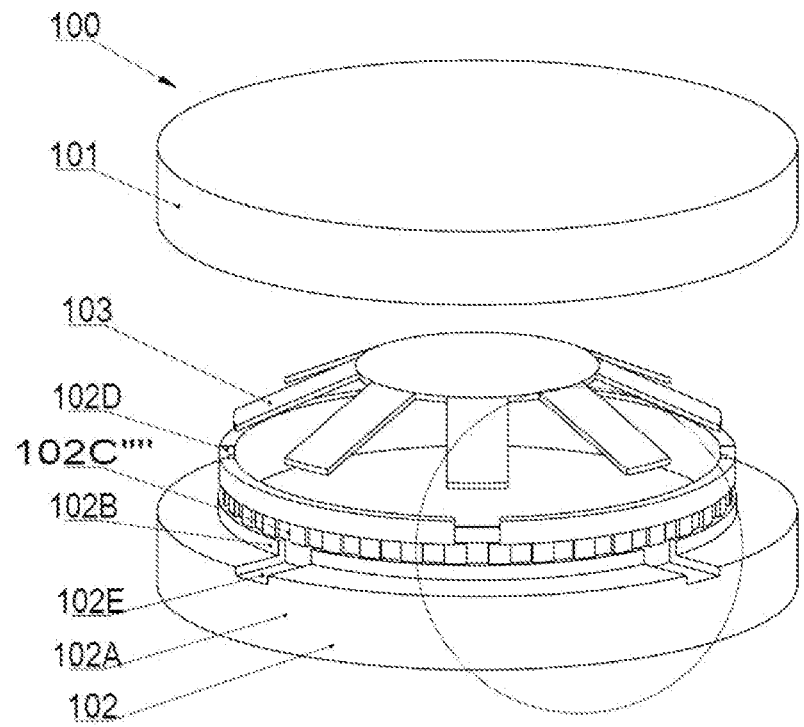
FIG. 13 shows an exploded perspective view of the ventilated puck according to a fifth embodiment of the present application.
Figure 14:
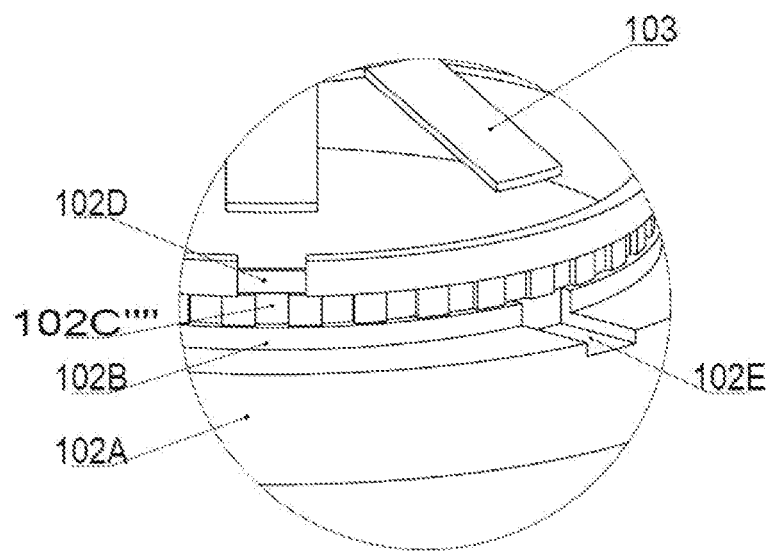
FIG. 14 is a partial view of FIG. 13, which shows details of an annular groove, of a straight groove, and of a short L-shaped groove.

FIG. 13 shows an exploded perspective view of the ventilated puck 100 according to a fifth embodiment of the present application. For the sake of simplicity, the technical features of this embodiment that are the same as those of the embodiment shown in FIG. 11 will not be repeated. The embodiment shown in FIG. 13 differs from the embodiment shown in FIG. 11 mainly in that the puck 100 has an annular groove 102C'''' provided in the outer circumferential face of the annular flange 102B, instead of a zigzag-shaped groove. The annular groove 102C'''' is concentric with the annular flange 102B. FIG. 14 is a partial view of FIG. 13, which shows details of the annular groove 102C''''. The annular groove 102C'''' may be provided with a plurality of for example, thirty-six rectangular protrusions at the bottom thereof, which are arranged at equal spacing along the circumference of the annular groove 102C'''', the width of which are the same as that of the annular groove 102C'''', and the height of which are less than the depth of the annular groove 102C''''. In addition, the circumference of the annular groove 102C'''' is uniformly provided with four straight grooves 102D. The straight groove 102D extends upward from the annular groove 102C'''' to the top edge of the annular flange 102B in the outer circumferential face of the annular flange 102B. The straight groove 102D is provided with a notch for facilitating the passage of gas at the top edge of the annular flange 102B. Besides, the circumference of the annular groove 102C'''' is also uniformly provided with four short L-shaped groove 102E. The short L-shaped groove 102E extends radially from the edge of the top face of the main body 102A of the lower box, turns 90 degrees at the interface between the main body 102A of the lower box and the annular flange 102B, and extends upward in the outer circumferential face of the annular flange 102B to the annular groove 102C''''. The straight groove 102D and the short L-shaped groove 102E are staggered, that is to say, the angular displacement between the adjacent straight groove 102D and short L-shaped groove 102E is 45°. By doing this, the technical effect of maximum ventilation channel length may be achieved, thereby improving the dustproof performance of the ventilated puck 100. It should be understood that, although the lower box 102 is uniformly provided with four straight grooves 102D and four short L-shaped grooves 102E in this embodiment, it is also conceivable to provide more or fewer straight grooves 102D as well as short L-shaped grooves 102E.

It should also be understood that, although the L-shaped groove, the zigzag-shaped groove or the annular groove is provided in the lower box in the embodiments depicted by the figures above, in a similarly way, the L-shaped groove, the zigzag-shaped groove or the annular groove may be also provided in the upper box. In practice, the L-shaped groove, the zigzag-shaped groove or the annular groove may be provided only on one of the lower and upper boxes.

The above is only an exemplary description of the present application, and is not intended to impose any formal limitation on the present application. Any simple modification, equivalent change, combination or variation made to the above embodiments in accordance with the technical essence of the present application still falls within the protection scope of the technical solution of the present application.

The invention claimed is:

1. A ventilated puck comprising:
    an upper box;
    a spider plate; and
    a lower box;
    wherein the upper box is fitted on the lower box to form a hollow structure, in which the spider plate is disposed; a ventilation channel for communicating the hollow structure with an external environment is provided in the upper box, or in the lower box or at an interface between the upper box and the lower box, wherein the ventilation channel is provided with a plurality of protrusions at a bottom of the ventilation channel, which are arranged at equal or unequal spacings, the widths of which are the same as that of the ventilation channel, and the heights of which are less than the depth of the ventilation channel,
    wherein the upper box is cylindrical, the upper box opens at a bottom and is constructed as a lid of the ventilated puck; the lower box comprises a main body, which is cylindrical, and an annular flange, which extends upward on a top face of the main body of the lower box, is concentric with the main body of the lower box, and has an outer diameter that is smaller than the maximum diameter of the main body of the lower box; the upper box is fitted on the annular flange, with a bottom face of the upper box being placed on the top face of the main body of the lower box, thereby forming the hollow structure,
    wherein the ventilation channel is provided between the upper box and the lower box, and is defined by an inner circumferential face of the upper box, the bottom face of the upper box, the top face of the main body of the lower box and an outer circumferential face of the annular flange together,
    and wherein a single ventilation channel is provided at the interface between the upper box and the lower box, or a plurality of ventilation channels is circumferentially provided at the interface between the upper box and the lower box evenly or unevenly; the ventilation channel comprises an L-shaped groove provided in the lower box or in the upper box; when provided in the upper box, the L-shaped groove extends radially from an edge of the bottom face of the upper box and across the bottom face of the upper box, turns 90 degrees, extends upward in the inner circumferential face of the upper box across the entire inner circumferential face of the upper box; the L-shaped groove is provided with a recess for the passage of gas in an inner top face of the upper box.

2. The ventilated puck according to claim 1, wherein the spider plate is a plate with a central elevated portion, and is positioned in the annular flange in a way that the central elevated portion faces up, wherein the central elevated portion of the spider plate rests against the inner top face of the upper box when the upper box and the lower box are fitted together.

3. The ventilated puck according to claim 2, wherein a knurled or serrated structure is arranged on an outer circumferential face of the upper box and on a circumferential face of the main body of the lower box; the spider plate comprises the central elevated portion, and a plurality of legs extending outwardly from an edge of the central elevated portion, wherein the plurality of legs are arranged evenly around a circumference of the central elevated portion, and each of which has an end in the form of a rectangle.

4. The ventilated puck according to claim 3, wherein when the L-shaped groove is provided in the lower box, the L-shaped groove extends radially from an edge of the top face of the main body, turns 90 degrees at an interface between the main body and the annular flange, and extends upward in the outer circumferential face of the annular flange across the entire annular flange; the L-shaped groove is provided with a notch for the passage of gas at a top edge of the annular flange.

5. The ventilated puck according to claim 4, wherein the ventilated puck is provided with three ventilation channels along the circumferential direction.

* * * * *